United States Patent [19]

Ogushi et al.

[11] Patent Number: 5,106,820
[45] Date of Patent: Apr. 21, 1992

[54] OXIDE SUPERCONDUCTOR AND PROCESS FOR PREPARATION THEREOF

[75] Inventors: Tetsuya Ogushi, Kagoshima; Gentaro Kaji; Saburo Nagano, both of Kokubu, all of Japan

[73] Assignee: Kyocera Corporation, Kyoto, Japan

[21] Appl. No.: 243,817

[22] Filed: Sep. 13, 1988

[30] Foreign Application Priority Data

Sep. 29, 1987 [JP] Japan .................. 62-247415

[51] Int. Cl.$^5$ ................................ B32B 9/00
[52] U.S. Cl. ........................ 505/1; 505/701; 505/702; 505/703; 505/704; 428/688; 428/930
[58] Field of Search ............ 505/1, 701–744, 505/728; 428/688, 930, 457

[56] References Cited

PUBLICATIONS

Effect of Donor Impurities on Charge Carrier Density of $YBa_2Cu_3O_7$, Han et al. Symposium Apr. 5–9, 1988, Reno, Nev.

Primary Examiner—Patrick J. Ryan
Attorney, Agent, or Firm—Spensley, Horn, Jubas & Lubitz

[57] ABSTRACT

Disclosed is an oxide superconductor, wherein at least the surface layer has a chemical composition represented by the following formula:

$$La_xSr_yNbO_z$$

wherein
$0<x<1$,
$0<y<1$, and
$1<z<4$, and has a critical temperature (Tc) higher than 100° K.

This superconducotr has a high critical temperature and is rendered superconducting by cooling with cheap liquefied nitrogen.

This superconductor is prepared by a process comprising carrying out sputtering in an argon atmosphere by using one of NB and an La—Sr—Cu—O oxide as the substrate and the other as the target under such a temperature condition that substitution of Cu by Nb is caused, an quencing the formed film.

5 Claims, 7 Drawing Sheets

OXIDE SUPERCONDUCTOR AND PROCESS FOR PREPARATION THEREOF

BACKGROUND OF THE INVENTION (1) Field of the Invention

The present invention relates to a bulky or filmy oxide superconductor which is used for a magnetic coil portion of a magnetic levitated vehicle or particle accelerator or a circuit substrate of an electronic device or Josephson element.

(2) Description of the Prior Art

At the present, a metal type superconductor represented by $Nb_3Ge$ or $Nb_3Sn$ is practically utilized as the superconductor, but the critical temperature (Tc) of the superconductor of this type is about 23.2° K. at highest.

However, it has recently been reported that the critical temperature of an oxide type superconductor composed of a mixture of a rare earth element, an alkaline earth metal element and copper oxide is much higher than the critical temperature of the metal type superconductor (for example, the group of the Department of Technology, Tokyo University, published in the physical Society of U.S.A. that the critical temperature of 90° K. was attained), and it has become possible to use cheap liquefied nitrogen sufficiently as the cooling medium instead of expensive liquefied helium which is liquefied at a cryogenic temperature (4.2° K.=−268.8° C.). Therefore, the prospect of the utilization of this oxide type superconductor in various fields is brightened. After these presentations, investigations have been vigorously made to further elevate the critical temperature (Tc) of a bulky or filmy oxide type superconductor almost to a level of normal temperature in these utilization fields. However, an oxide superconductor having a sufficiently high critical temperature (Tc) has not yet been known.

SUMMARY OF THE INVENTION

It is therefore a primary object of the present invention to provide a novel oxide superconductor which has a high critical temperature (Tc) and is rendered superconducting by cooling with cheap liquefied nitrogen, and a process for the preparation of this novel oxide superconductor.

Another object of the present invention is to provide a process in which an oxide superconductor as mentioned above can be prepared by a sputtering film-forming technique.

In accordance with one aspect of the present invention, there is provided a process for the preparation of an La—Sr—Nb—O type oxide superconductor, which comprises carrying out sputtering in an argon atmosphere by using one of Nb and an La—Sr—Cu—O oxide as the substrate and the other as the target under such a temperature condition that substitution of Cu by Nb is caused, and quenching the formed film.

In accordance with another aspect of the present invention, there is provided an oxide superconductor, wherein at least the surface layer has a chemical composition represented by the following formula:

$$La_xSr_yNbO_z$$

wherein
$0<x<1$,
$0<y<1$, and
$1<z<4$, and has a critical temperature (Tc) higher than 100° K.

DETAILED DESCRIPTION OF THE PREFERRED EMBODIMENTS

The present invention is based on the finding that if an La—Sr—Cu—O type oxide is sputtered on metallic Nb or metallic Nb is sputtered on an La—Sr—Cu—O type oxide, Nb is diffused in the La—Sr—Cu—O type oxide, Cu is substituted by Nb and a superconductor composed of an La—Sr—Nb—O type oxide and having a high critical temperature (Tc), that is, a high off-set temperature is obtained.

Figure 1:
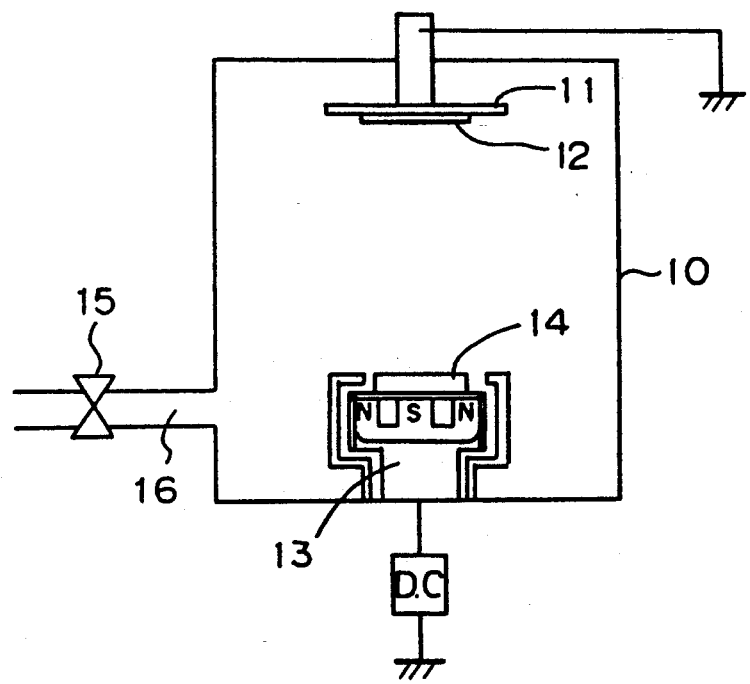
FIG. 1 is a schematic diagram illustrating the arrangement of a magnetron sputtering apparatus which is used for the preparation of an oxide superconductor.

Referring to FIG. 1 illustrating a magnetron sputtering apparatus which is used in the process of the present invention, a support 11 having a heater (not shown in the drawings) built therein is arranged in the interior of a pressure-proof chamber 10, and a substrate 12 is mounted on the support 11. A planar magnetron type cathode 13 is arranged to confront the support 11, and a sputtering target 14 is mounted on the cathode 13. The chamber 10 is connected to a supply-exhaust opening 16 provided with a valve 15. According to a preferred embodiment of the present invention, the chamber 10 is cooled by liquefied nitrogen or the like.

According to the present invention, metallic niobium is used as the substrate 12 and an La—Sr—Cu—O type oxide is used as the target 14. Alternatively, an La—Sr—Cu—O type oxide is used as the substrate 12 and Nb metal is used as the target 14.

Figure 3:
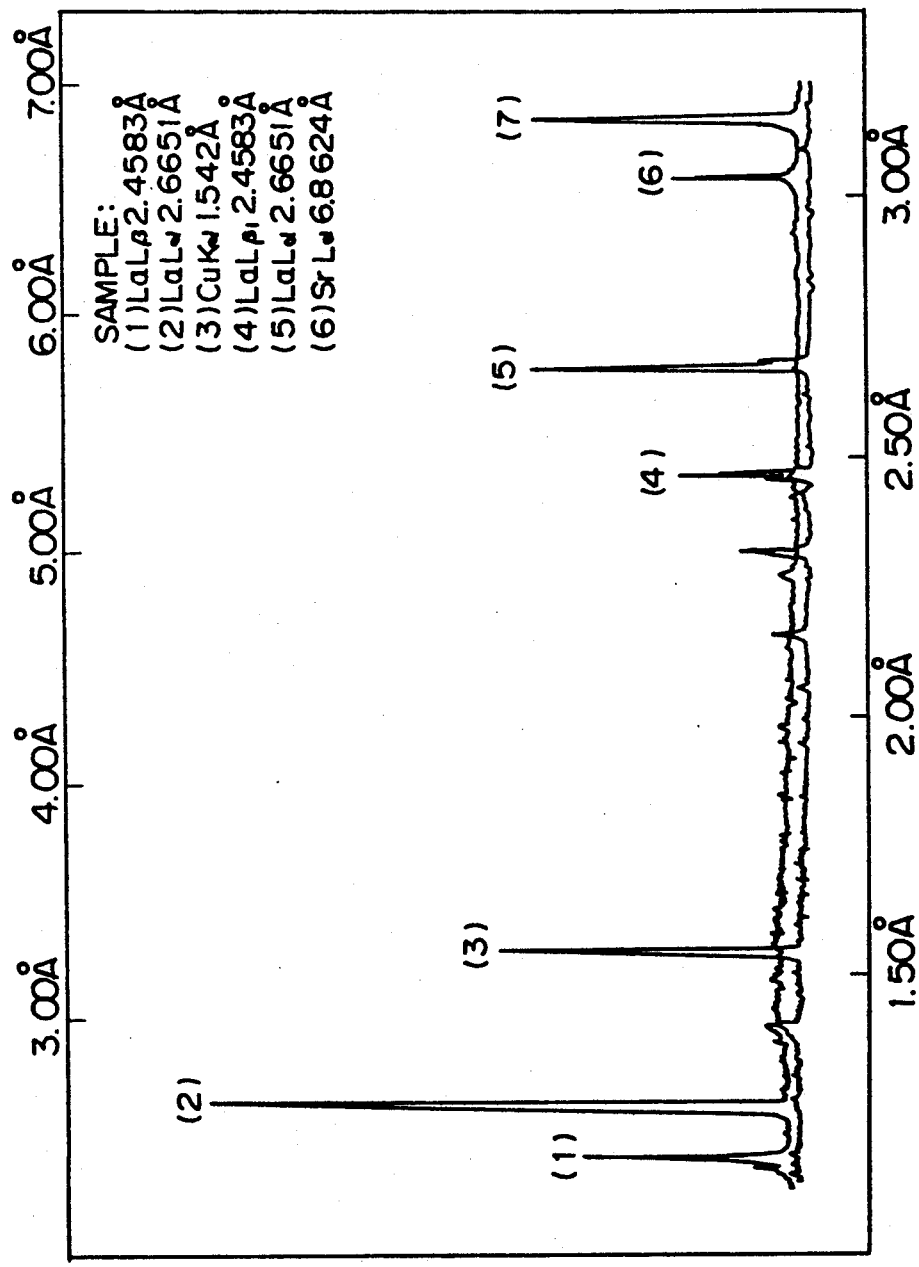
FIG. 3 shows a composition analysis pattern of a sputtering target used in Example 1, which is obtained by an electron probe microanalyzer (EPMA).

As the La—Sr—Cu—O type oxide, a sintered body having these elements is used. However, the composition of the La—Sr—Cu—O type oxide is changed during the sputtering step, and hence, it is indispensable that the respective elements should be supplied in amounts sufficient to form a superconductor. More specifically, an oxide having a composition represented by the following formula:

$$La_xSr_yCuO_z \tag{1}$$

wherein x is a number of from 0.1 to 10, y is a number of from 0.1 to 10 and z is a number of from 1.25 to 26.5, is used. A sintered body having a composition of $LaSrCuO_4$ is especially preferred. FIG. 3 shows a composition analysis pattern of this sintered body by EPMA. In general, the La—Sr—Cu—O type oxide sintered body may be electrically insulating.

The thickness of the substrate 12 is such that the Nb, La, Sr and O components are sufficiently supplied in the final superconductor. In the case of the Nb metal substrate, the thickness is 20 to 50 μm, and in case of the La—Sr—Cu—O type oxide substrate, the thickness is 100 to 3000 μm.

The sputtering is carried out in an argon atmosphere under such conditions that substitution of Cu by Nb is caused. More specifically, before the sputtering, the pressure in the chamber 10 is reduced to about $10^{-8}$ to about $10^{-7}$ Torr, and the Ar pressure is maintained at 0.05 to 0.8 Torr, especially 0.1 to 0.7 Torr. Simultaneously, the substrate 12 is heated at 600° to 1250° C., especially 700° to 1200° C., and the sputtering is carried out in this state. The magnetron sputtering conducted under a voltage of 200 to 300 V at an electric current of 300 to 400 mA is preferred as the sputtering. It is preferred that the partial pressure of oxygen be maintained to up to $10^{-4}$ Torr during the sputtering.

In the case of the Nb metal substrate, it is preferred that the film-forming rate be adjusted to 50 to 500 Å/min, especially 100 to 200 Å/min, and in the case the La—Sr—Cu—O type oxide substrate, the film-forming speed (hereinafter referred to as "sputtering rate") is preferably adjusted to 100 to 5000 Å/min.

In the present invention, in order to stabilize the superconductor phase, it is preferred that after the sputtering, the formed film be quenched. If the operation is carried out in the state where the sputtering chamber 10 is cooled by liquefied nitrogen, quenching of the film immediately starts on breaking of an electric current to the heater after completion of the sputtering. Accordingly, this operation is preferred. The quenching is preferably effected to a temperature of about 400° C. at a cooling speed of 400° to 3000° C./hr.

In order to control the amount of oxygen in the final superconductor, the formed film can be brought into contact with an oxygen atmosphere maintained under 1 to 5 Torr at a temperature of 400° to 700° C. in the midway of the quenching operation.

According to the present invention, a superconductor in which at least the surface layer is composed of an La—Sr—Cu—O type oxide and the critical temperature (Tc) is in the range of not less than 100° K., especially 200° to 300° K., is obtained by the above-mentioned procedures. When FIG. 3 is compared with FIG. 4, it is seen that in the superconductor, the characteristic peak of Cu disappears and the characteristic peak of Nb appears instead of the peak Cu. Accordingly, in can be understood that Cu is substituted by Nb.

According to a preferred embodiment of the present invention, at least the surface layer of the superconductor has a composition represented by the following formula:

$$La_xSr_yNbO_z \qquad (2)$$

wherein
 0<x<1,
 0<y<1, and
 1<z<4.
Especially preferably, at least the surface layer has a composition of $La_2SrNb_5O_{10}$.

Figure 7:
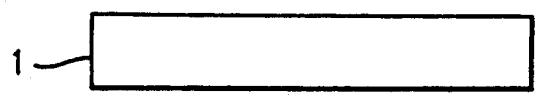
FIGS. 7, 8 and 9 are sectional views illustrating several embodiments of the superconductor of the present invention.
Figure 8:
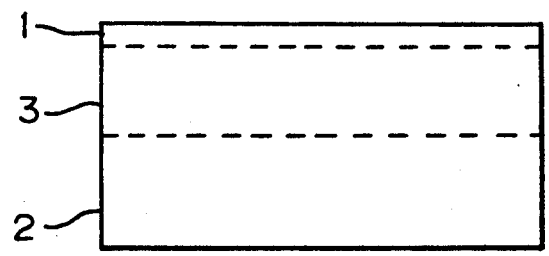

The superconductor of the present invention may be composed entirely of an La—Sr—Nb—O type oxide 1, as shown in FIG. 7, or the superconductor may comprise a surface layer of an La—Sr—Nb—O type oxide 1, a lower layer of Nb metal 2 and a intermediate transitional layer 3 in which the Nb content ratio gradually increases toward the lower layer from the surface layer, as shown in FIG. 8. Furthermore, the superconductor of the present invention may comprise a surface layer of an La—Sr—Nb—O type oxide 1 and a lower layer of an La—Sr—Cu—O type oxide 4, as shown in FIG. 9.

Figure 9:
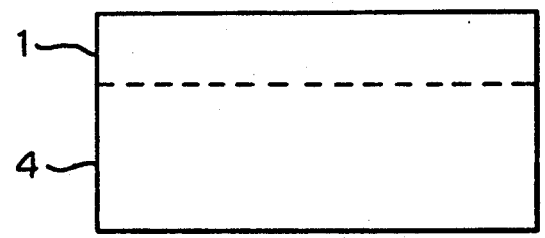

In the superconductor of the type shown in FIG. 9, it sometimes happens that an intermediate transitional layer in which the Nb content ratio gradually decreases toward the lower layer from the surface layer is formed between the surface layer 1 and the lower layer 4.

As is apparent from the foregoing description, by the formation of a layer having a gradient of the content of the constituent element, a non-equilibrium phase is formed, whereby the entire system is stabilized.

The superconductor of the present invention has a critical temperature higher than the liquefied nitrogen temperature 77.3 (°K.), especially a critical temperature higher than 100° K. This can be readily understood from FIGS. 2 and 5. Furthermore, the superconductor of the present invention shows a Meissner effect of about −5 to about −30% based on the diamagnetization of Nb at 9.2° K.

The present invention will now be described in detail with reference to the following examples that by no means limit the scope of the invention.

EXAMPLE 1

Compound $LaSrCuO_4$ was sputtered on a metallic Nb sheet having a thickness of 0.03 mm to from a film. The film-forming sputtering operation was carried out under an Ar pressure of 0.1 to 0.4 Torr and a voltage of 200 to 300 V at an electric current of 300 to 400 mA by using a direct-current high-speed magnetron sputtering apparatus in a liquefied nitrogen tank. Before the sputtering, the inner pressure of a bell jar was reduced to about $10^{-7}$ Torr, and the sputtering was carried out under an $O_2$ partial pressure of about $10^{-4}$ Torr. The sputtering target ($LaSrCuO_4$) was used after it had been annealed at 900° C. for 8 hours.

During the sputtering, the temperature was maintained at 700° to 800° C. by heating, and the temperature was lowered to room temperature at a rate of 400° C./hr by quenching after the sputtering. The characteristics of the formed film are influenced by this cooling rate, and according to the present invention, the characteristics can be stabilized by quenching. The thickness of the formed film was 20 μm.

The resistance was measured according to the four-terminal method. The electrode was formed by ultrasonic soldering of In (indium). The measurement electric current density was 10 A/cm² and was changed at intervals. The temperature of the sample was measured by an Au-0.07% Fe-Chromel thermocouple, and liquefied helium and liquefied nitrogen were used as the cooling medium. Heating to temperatures higher than room temperature was effected by blowing of warm air. The rate of cooling to the liquefied helium temperature from room temperature was adjusted to about 300° K./hr. The Ac diamagnetization was measured according to the induction bridge method.

Figure 2:
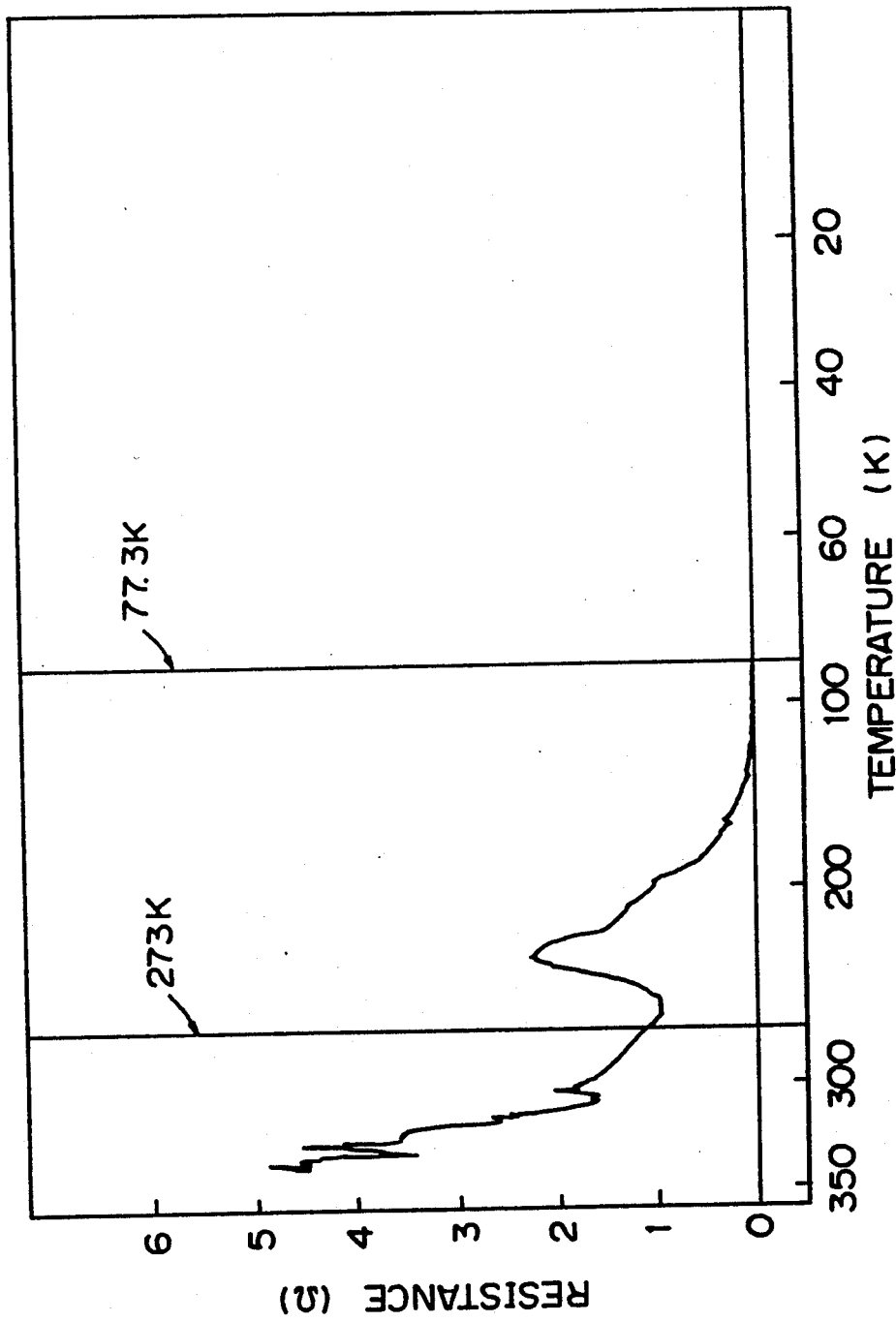
FIG. 2 is a curve showing the resistance-temperature characteristics of a superconductor obtained in Example 1.

The sample was heated to 335° K. by blowing of warm air and was then cooled. The resistance abruptly decreased on the start of cooling, and a resistance-temperature characteristic curve as shown in FIG. 2 was obtained. As is seen from FIG. 2, the on-set temperature of the sample was at least 228° K. and the off-set temperature was at least 100° K. Namely, a superconductor in which the resistance was reduced to zero (0) at 100° K. (−173° C.) was obtained.

Figure 4:
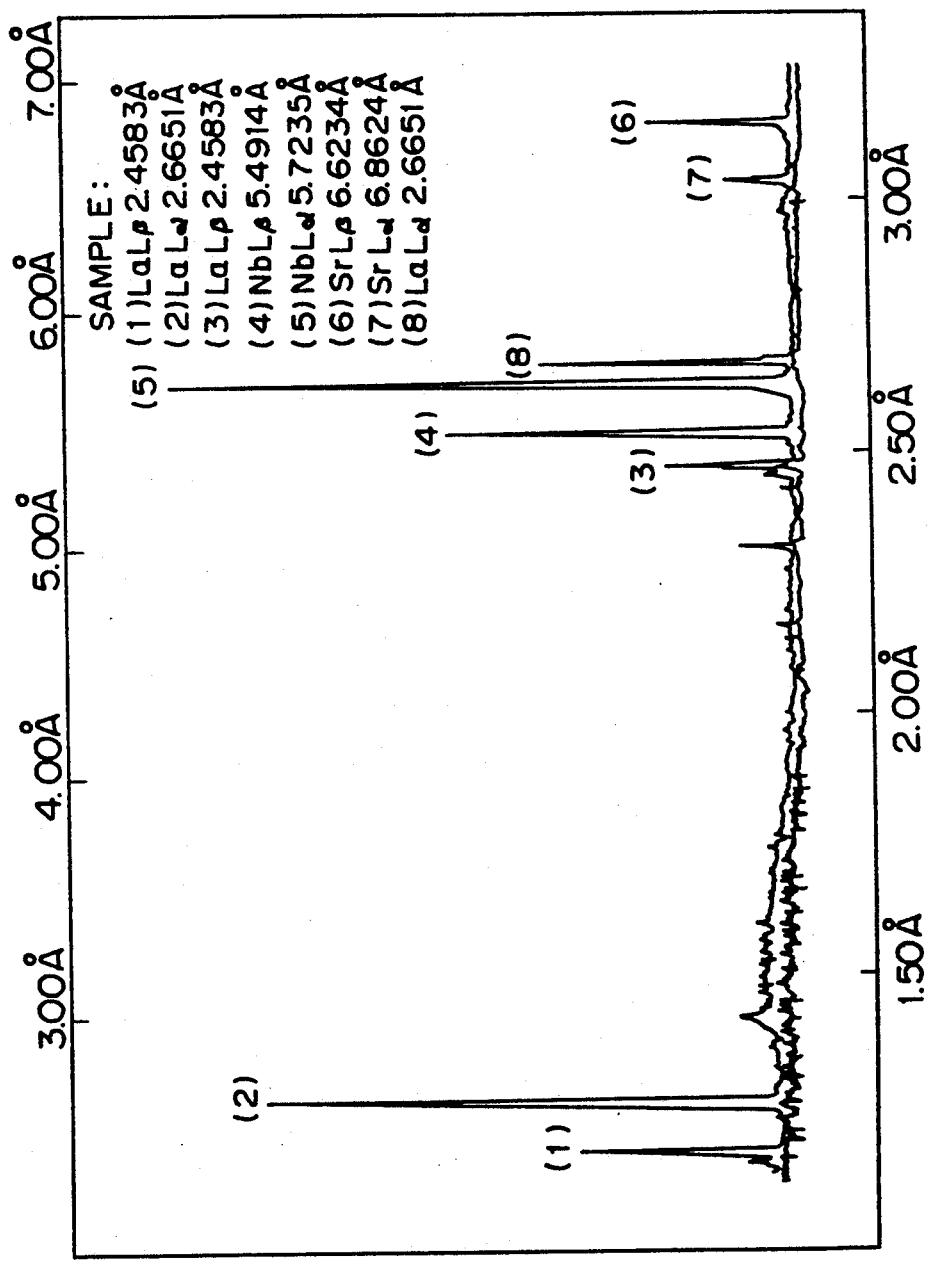
FIG. 4 shows an EPMA composition analysis pattern of the superconductor obtained in Example 1.

Incidentally, the sputtering target (LaSrCuO$_4$) and the crystal phase of the formed film were analyzed by EPMA (electron probe microanalyzer) to obtain results shown in FIGS. 3 and 4. As is apparent from the comparison of FIGS. 3 and 4, after the formation of the film, the peak of Cu disappeared and the strong peak of Nb appeared instead of the peak of Cu. Namely, Cu in LaSrCuO$_4$ was substituted substantially completely by Nb. The reason is considered to be that since Nb has a strong affinity with O and is apt to form a perovskite structure represented by KNbO$_3$, Cu at the center of the oxygen octahedron is substituted by Nb. Incidentally, it is seen that the amounts of La and O were not greatly changed but the amount of Sr slightly decreased.

EXAMPLE 2

A bulk composed of La—Sr—Nb—O was prepared in a high-vacuum apparatus. A plate of LaSrCuO$_4$ having a size of 2 mm (thickness)×5 mm (width)×10 mm (length) was used as the substrate. The pressure in a bell jar was reduced to 10$^{-8}$ Torr, and Nb (having a purity of 99.9%) was sputtered on the LaSrCuO$_4$ substrate under an argon pressure of about 0.5 Torr. The temperature of the substrate was maintained at 900° C. and the sputtering rate was adjusted to about 100 Å/mm. After the sputtering, the substrate was maintained at 700° C. in the bell jar for 30 minutes. The composition of Nb was adjusted according to the sputtering time. The inner wall of the chamber was covered with a Cu film by the sputtering. Accordingly, it is considered that Cu was substituted by Nb and Cu was scattered from the LaSrCuO$_4$ substrate.

The measurement was conducted in the same manner as described in Example 1, and it was found that the resistance began to sharply decrease in the room temperature region where the on-set temperature (Tco) was at least 200° K., and the sample showed a Meissner effect.

EXAMPLE 3

Compound LaSrCuO$_4$ was sputtered on an Nb foil having a thickness of 200 μm. The film-forming sputtering was carried out at a sputtering rate of 5000 Å/min in a chamber cooled by liquefied nitrogen according to the direct-current high-speed magnetron sputtering method using a target of LaSrCuO$_4$ having a diameter of 100 mm. The thickness of the film was about 15 μm and the film had a square shape having a side of 4 mm. The sputtering was carried out under an argon pressure of 0.5 to 0.7 Torr and the substrate temperature was 1200° C.

After the sputtering, the sample was quenched to 400° C. from 1200° C. at a rate of 50° C./min and maintained in oxygen (O$_2$) under a pressure of 2 Torr for 5 minutes.

The measurement was carried out in the same manner as described in Example 1. The electric current density at the measurement was 3 A/cm$^2$, but also the current density of 10 A/cm$^2$ was adopted so as to examine the current dependency.

The analysis of the composition was performed by EPMA and IMA (ion microanalyzer). The amounts of La and Sr were not greatly changed but the presence of Cu was not detected. From the results of the IMA analysis, it was found that a gradient of the Nb content was present in the thickness direction from the Nb foil to the Nb oxide. The composition of La—Sr—Cu—O$_4$ on the Nb foil was changed to an La—Sr—Nb—O film. By diffusion of Nb from the Nb foil into the La—Sr—Nb—O film, Cu in the film was substituted by Nb, and Cu at the center of the oxygen octahedron was replaced by Nb. A layer having a composition of La$_2$Sr$_1$Nb$_5$O$_{10}$ was formed in the surface portion.

Figure 5:
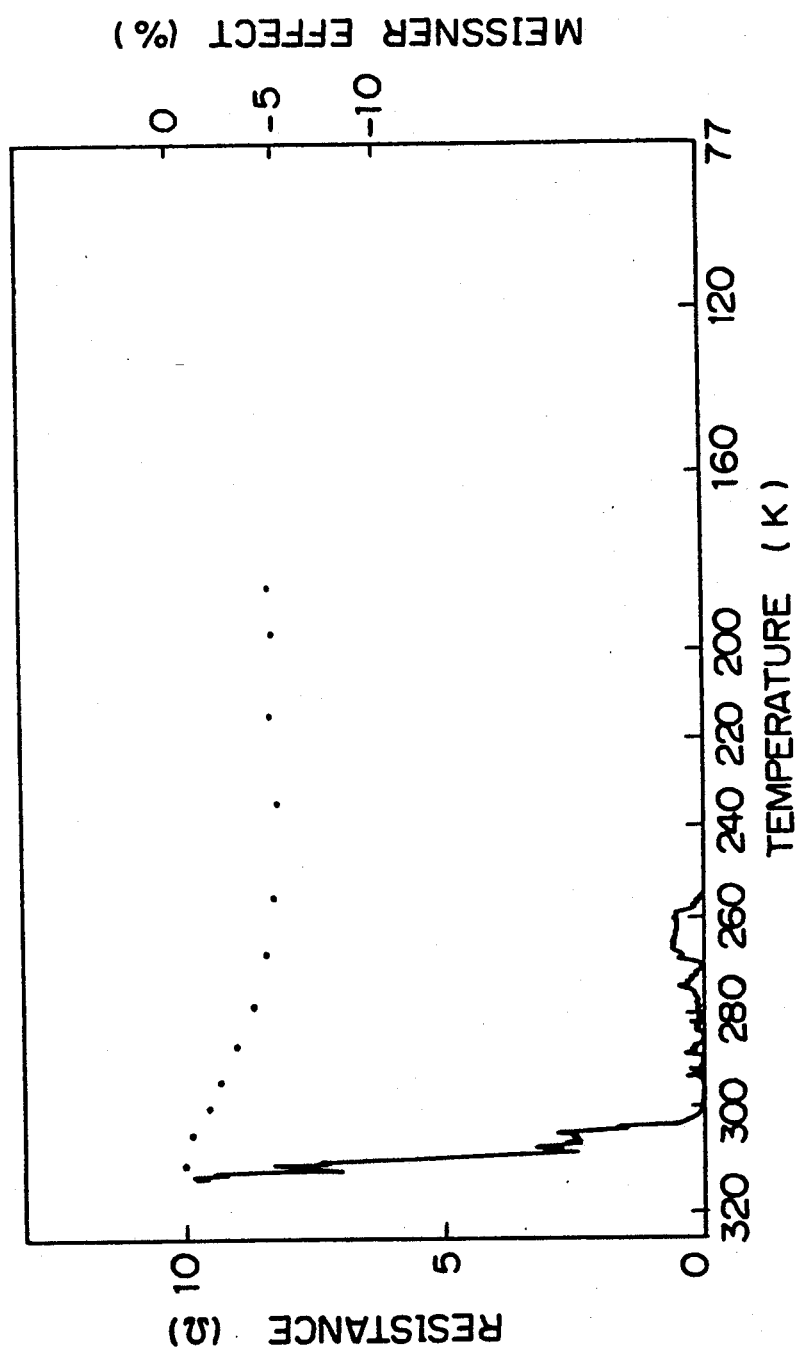
FIG. 5 is a graph illustrating the resistance-temperature and Meissner effect-temperature characteristics of a superconductor obtained in Example 3.

The resistance-temperature and Meissner effect-temperature characteristics of the sample were determined. The obtained results are shown in FIG. 5. Just after stopping of heating by warm air, the resistance began to abruptly decrease, and at 300° K., the resistance was reduced to zero (0) though at a noise level. The noise continued to the point of 255° K. The negative diamagnetization was 5% of the diamagnetization of Nb at 9.2° K. and the presence of a Meissner effect was confirmed.

Figure 6:
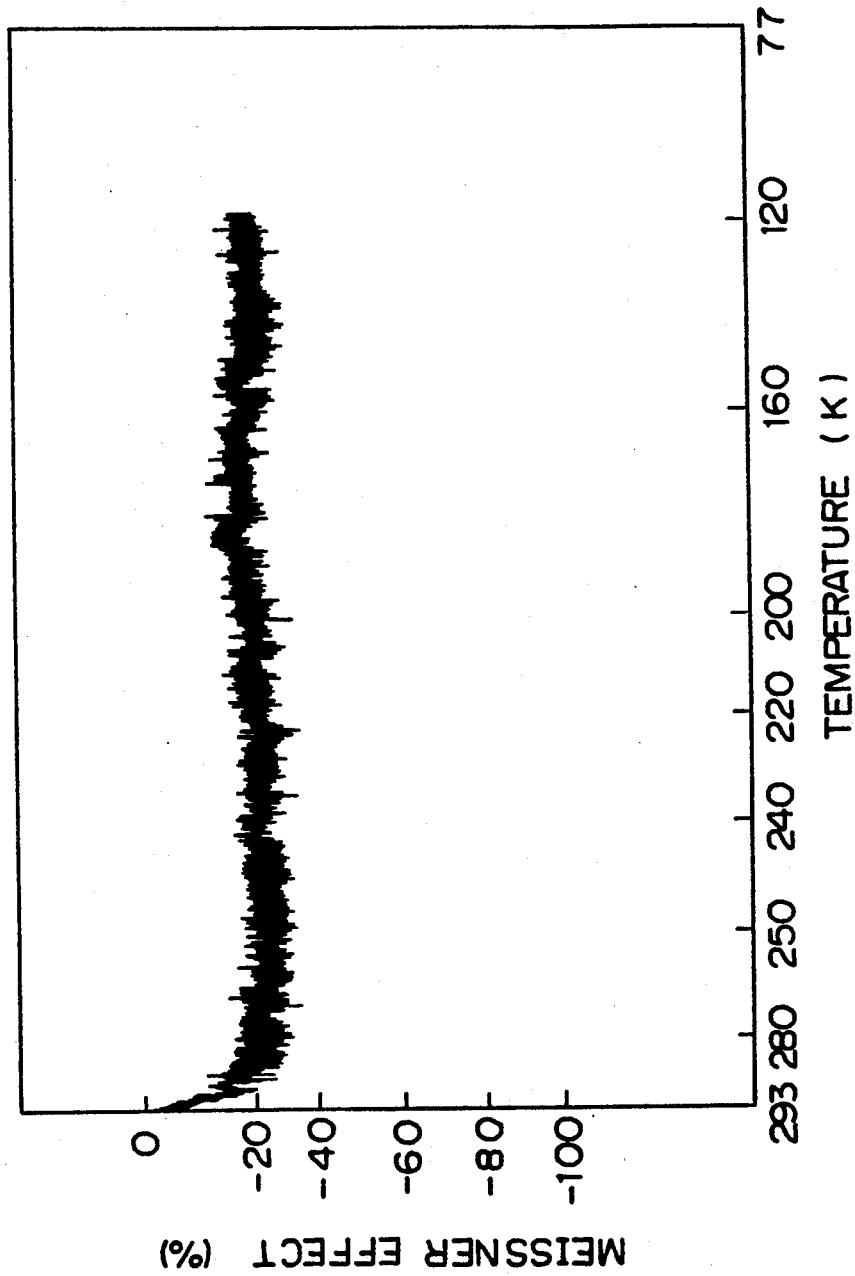
FIG. 6 is a graph illustrating the Meissner effect-temperature characteristics of another superconductor obtained in Example 3.

Incidentally, a sample having such a large diamagnetization as 20% of that of Nb at about 280° K. was obtained, as shown in FIG. 6.

We claim:

1. A superconductor, which comprises a surface layer having a composition substantially represented by the formula of La$_2$SrNb$_5$O$_{10}$ and a lower layer having a composition represented by the formula of LaSrCuO$_4$.

2. An oxide superconductor body having a surface, wherein at least a layer of the body adjacent the surface has a chemical composition represented by the following formula:

La$_x$Sr$_y$NbO$_z$ wherein

0<x<1,

0<y<1, and

1<z<4, and has a critical temperature (Tc) higher than 100° K.

3. A superconductor as set forth in claim 2, wherein at least the surface layer has a composition substantially represented by the formula of La$_2$SrNb$_5$O$_{10}$.

4. A superconductor as set forth in claim 2, wherein at least the surface layer has substantially the same pattern as that shown in FIG. 3 at the analysis by an electron probe microanalyzer.

5. A superconductor, which comprises a surface layer having a composition substantially represented by the formula of La$_2$SrNb$_5$O$_{10}$, a lower layer containing metallic Nb, and an intermediate layer interposed between the surface layer and the lower layer and having an Nb concentration which increases toward the lower layer from the surface layer.

* * * * *